US008621294B2

(12) United States Patent
Murray

(10) Patent No.: US 8,621,294 B2
(45) Date of Patent: Dec. 31, 2013

(54) APPARATUS, METHODS, AND SYSTEM OF NAND DEFECT MANAGEMENT

(71) Applicant: Micron Technology, Inc., Boise, ID (US)

(72) Inventor: Michael Murray, Mountain View, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/751,550

(22) Filed: Jan. 28, 2013

(65) Prior Publication Data
US 2013/0139012 A1 May 30, 2013

Related U.S. Application Data

(60) Division of application No. 13/194,212, filed on Jul. 29, 2011, now Pat. No. 8,365,028, which is a division of application No. 12/705,916, filed on Feb. 15, 2010, now Pat. No. 7,992,060, which is a continuation of application No. 11/710,794, filed on Feb. 26, 2007, now Pat. No. 7,669,092.

(51) Int. Cl.
*G11C 29/00* (2006.01)
(52) U.S. Cl.
USPC .......................................... 714/723
(58) Field of Classification Search
USPC ........ 714/723, 718, 710, 6.12, 6.13; 365/201, 365/185.33, 230.03
See application file for complete search history.

(56) References Cited

U.S. PATENT DOCUMENTS

| 5,239,681 | A | | 8/1993 | Parnell et al. |
| 5,563,828 | A | | 10/1996 | Hasbun et al. |
| 5,815,664 | A | | 9/1998 | Asano |
| 6,035,432 | A | * | 3/2000 | Jeddeloh ........................ 714/763 |
| 6,069,827 | A | * | 5/2000 | Sinclair ..................... 365/185.29 |
| 6,192,072 | B1 | | 2/2001 | Azadet et al. |
| 6,738,887 | B2 | | 5/2004 | Colpo et al. |

(Continued)

FOREIGN PATENT DOCUMENTS

| CN | 1648876 A | 8/2005 |
| EP | 1564755 A2 | 8/2005 |
| WO | WO-2008106095 A1 | 9/2008 |

OTHER PUBLICATIONS

"Chinese Application Serial No. 200880006029.3, Office Action mailed Mar. 8, 2012", With English Translation, 7 pgs.

(Continued)

*Primary Examiner* — Phung M Chung
(74) *Attorney, Agent, or Firm* — Schwegman, Lundberg & Woessner, P.A.

(57) ABSTRACT

Various embodiments comprise a method, the method comprising determining whether each of a plurality of memory blocks in a memory device is defective, wherein the plurality of memory blocks are organized into memory block groups, and one of the memory block groups comprises a base memory block group; forming a grouping of non-defective memory blocks; forming a remapped grouping of memory blocks that includes a non-defective memory block from the base memory block group and at least one non-defective memory block in another memory block group that includes a defective memory block; and storing a mapping of the remapped grouping in at least one of the memory device and a processor coupled to the memory device.

20 Claims, 5 Drawing Sheets

(56) References Cited

U.S. PATENT DOCUMENTS

| | | |
|---|---|---|
| 6,742,078 B1 | 5/2004 | Chien et al. |
| 6,763,480 B2 | 7/2004 | Harari et al. |
| 6,901,498 B2 | 5/2005 | Conley |
| 6,931,509 B2 | 8/2005 | Lloyd-Jones |
| 7,149,855 B2 | 12/2006 | Chen et al. |
| 7,159,141 B2 * | 1/2007 | Lakhani et al. ............. 714/6.13 |
| 7,191,306 B2 | 3/2007 | Myoung et al. |
| 7,315,917 B2 | 1/2008 | Bennett et al. |
| 7,620,769 B2 | 11/2009 | Lee et al. |
| 7,669,092 B2 | 2/2010 | Murray |
| 7,743,303 B2 * | 6/2010 | Nobunaga et al. ............ 714/736 |
| 7,970,985 B2 | 6/2011 | Gonzalez et al. |
| 7,992,060 B2 | 8/2011 | Murray |
| 8,365,028 B2 | 1/2013 | Murray |
| 2004/0221128 A1 | 11/2004 | Beecroft et al. |
| 2005/0144516 A1 * | 6/2005 | Gonzalez et al. ................. 714/8 |
| 2006/0161724 A1 | 7/2006 | Bennett et al. |
| 2006/0161728 A1 | 7/2006 | Bennett et al. |
| 2008/0071976 A1 | 3/2008 | Chow et al. |
| 2008/0091872 A1 | 4/2008 | Bennett et al. |
| 2008/0209107 A1 | 8/2008 | Murray |
| 2008/0313389 A1 | 12/2008 | Chow et al. |
| 2010/0082893 A1 | 4/2010 | Ma et al. |
| 2010/0153793 A1 | 6/2010 | Murray |
| 2011/0296261 A1 | 12/2011 | Murray |

OTHER PUBLICATIONS

"European Application Serial No. 08726059.2, Office Action mailed May 6, 2010", 3 pgs.

"European Application Serial No. 08726059.2, Office Action mailed Jun. 1, 2012", 4 pgs.

"European Application Serial No. 08726059.2, Office Action mailed Nov. 3, 2011", 4 pgs.

"Taiwanese Application Serial No. 097106681, Office Action mailed Jan. 19, 2012", 7 pgs.

"Taiwanese Application Serial No. 097106681, Response file Apr. 27, 2012 to Office Action mailed", 14 pgs.

"Chinese Application Serial No. 200880006029.3, Office Action mailed Feb. 4, 2013", 12 pgs.

"Chinese Application Serial No. 200880006029.3, Response filed Apr. 15, 2013 to Office Action mailed Feb. 4, 2013", 14 pgs.

"Korean Application Serial No. 10-2009-7020137, Voluntary Amendment filed Feb. 26, 2013", 25 pgs.

* cited by examiner

| Mapping Table Row # | Base Erase Block Group # | Erase Block # from the 2nd Erase Block Group | ... | Erase Block # from the Mth Erase Block Group |
|---|---|---|---|---|
| 0 | 1 | 3 | | 1st remapped erase block– Mth group |
| 1 | 5 | 4 | | 2nd remapped erase block– Mth group |
| 2 | | | | 3rd remapped erase block– Mth group |
| 3 | | | ⋮ | |
| ... | | ... | | |
| | | | | |

Fig. 3

| INDEX TABLE ROW # | RANGES OF GROUP ADDRESSES | OFFSET |
|---|---|---|
| 0 | 0-1 | 0 |
| 1 | 2-3 | 0 |
| 2 | 4-5 | 1 |
| 3 | 6-7 | 1 |
| 4 | 8-9 | 1 |
| ⋮ | | ⋮ |
| | | |

Fig. 4

APPARATUS, METHODS, AND SYSTEM OF NAND DEFECT MANAGEMENT

PRIORITY APPLICATIONS

This application is a divisional of U.S. application Ser. No. 13/194,212, filed Jul. 29, 2011, now issued as U.S. Pat. No. 8,365,028 which is a divisional of U.S. application Ser. No. 12/705,916, filed Feb. 15, 2010, now issued as U.S. Pat. No. 7,992,060, which is a continuation of U.S. application Ser. No. 11/710,794 filed Feb. 26, 2007, now issued as U.S. Pat. No. 7,669,092, all of which are incorporated herein in their entirety by reference.

TECHNICAL FIELD

Various embodiments described herein relate generally to non-volatile memory devices including defect management in conjunction with non-volatile memory devices.

BACKGROUND

Memory devices can be categorized into two broad areas: volatile and non-volatile. Volatile memory devices require power to maintain data, while non-volatile memories are capable of maintaining data in the absence of a power supply. An example of a non-volatile memory is the flash memory that stores information in a semiconductor device without the need for power to maintain the information in the chip.

Flash memory can be built using either NOR or NAND devices. NAND flash can be either of single-level cell (SLC) or multi-level cell (MLC) configuration. MLC NAND flash allows for a higher density memory device in comparison to SLC NAND flash because it allows the storage of two or more data bits in each memory cell.

Various memory operations, when performed on memory devices such as NAND flash memory devices, may need to be performed on an entire portion of the memory device in a same operation. For example, when performing an erase operation on a NAND flash memory, the erase operation may need to be performed on an entire block of memory, sometimes referred to as an erase block, as part of the same operation. Grouping one or more erase blocks together to form a group of erase blocks that can be operated on as a single block may speed up the memory operations, and may reduce the overhead required to manage and track the operations that include these grouping of erase block of a memory device. However, in some instances involving the grouping of erase blocks, if any one of the erase blocks in the group is determined to be defective, or fails at some time later in the life of the memory, the entire grouping of erase blocks that includes the defective erase block is marked as a defective block. These defective blocks that include grouping of erase blocks and may not be used by the device or devices using this memory in any memory operations. This results in wasted memory within a memory array, including wasting the good erase blocks that are grouped together with the defective erase block.

Various schemes to re-group the good erase blocks into usable groups including only non-defective erase blocks, and thus regain the use of these erase blocks may be performed. However, these schemes can become complicated to perform when testing and allocating the erase blocks, and the overhead associated with the management of these schemes during the actual memory operations may require a large amount of resources and processing time, which may lead to reduced speed and loss of other performance characteristics of the device that include the memory array incorporating one or more of these schemes. Thus, there is a need for improved apparatus, methods, and systems that allow grouping of erase blocks in a memory array that is simple to implement and reduces the amount of resources and overhead required to manage the memory operations performed on the memory array.

BRIEF DESCRIPTION OF THE DRAWINGS

FIG. 3 is a mapping table according to various embodiments of the invention;

FIG. 4 is an index table according to various embodiments of the invention; and

DETAILED DESCRIPTION

Various apparatus, methods, and systems are described herein including a simple way to perform grouping of erase blocks when one or more defective erase blocks are present in a memory device, such as a flash memory device or a NAND flash memory device. The apparatus, methods, and systems of the various embodiments described herein provide for combining a plurality of erase blocks into one or more groups of erase blocks. In various embodiments, these groupings include only non-defective erase blocks. In various embodiments, all the groupings are of the same size and include the same number of erase blocks. Such groupings of erase blocks minimize the complexity of the scheme used in determining how the erase blocks are to be grouped together while minimizing the overhead management required to perform memory operation on the memory array using one or more of the various embodiments as described herein.

Figure 1:
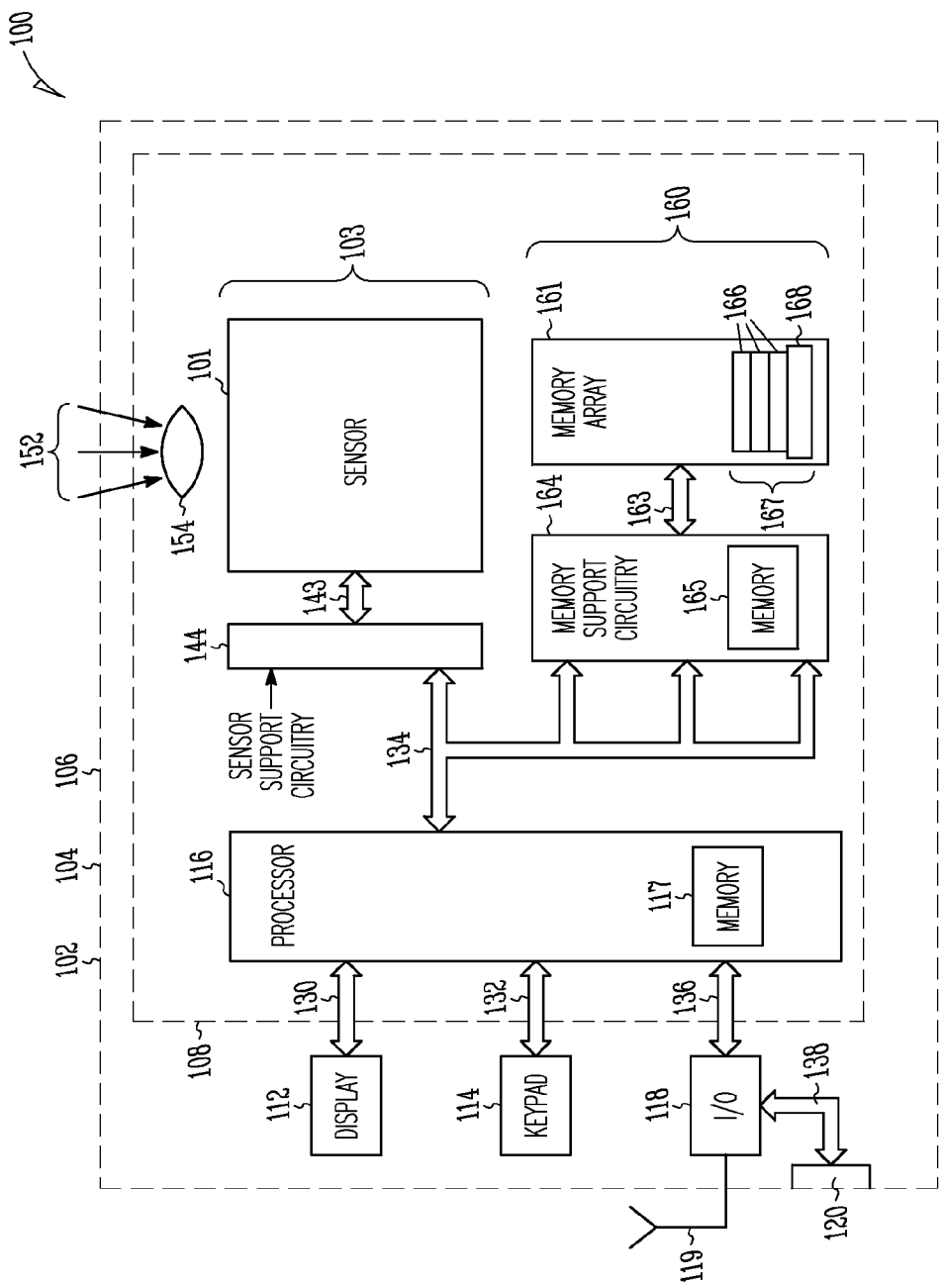
FIG. 1 is a block diagram of a system according to various embodiments of the invention.

FIG. 1 is a block diagram of a system according to various embodiments of the invention. FIG. 1 includes a block diagram of a system 100 according to various embodiment of the invention.

In some embodiments, system 100 includes a processor 116 and a memory device 160. Processor 116 is not limited to any particular type of processor. Processor 116 may be formed on substrate 108, although embodiments are not limited to the processor 116 being formed on the substrate 108, and/or to the processor 116 being formed on a substrate 108 including memory device 160 or including imaging sensor 103. The processor 116 may include memory 117, which is not limited to any particular type of memory, may comprise volatile and non-volatile types of memory, and may include cache memory. In various embodiments, memory 117 may be used to store electronic signals provided by sensor 101. In various embodiments, memory 117 may store a mapping table, an index table, or both a mapping table and an index table as included in various embodiments described herein. In various embodiments, processor 116 may be coupled to a plurality of electronic circuits on substrate 108 through one or more interconnects, including interconnect 134, which may comprise a bus.

In some embodiments, memory device 160 includes a memory array 161 coupled to memory support circuitry 164 though interconnect 163. Memory array 161 is not limited to any particular type of memory array, and may include non-volatile memory comprising NAND flash memory. In various embodiments, memory array 161 may be organized into a plurality of erase blocks. In various embodiments, these erase blocks are further organized into pluralities of erase block groups as described herein. Support circuitry may include column address and row address decoder circuits, driver circuitry for writing data to and providing data outputs from the memory array 161, interface circuitry to allow memory support circuitry 164 to process signals received and provided on interconnects 134 and 163. Memory support circuitry 164 may also include memory 165. In various embodiments, memory 165 includes a mapping table and index table, or both a mapping table and an index table as described in conjunction with various embodiment included herein.

The system 100 may include an imaging sensor 103. Imaging sensor 103 is not limited to any particular type of imaging sensor, and may include any type of imaging sensor capable of sensing electromagnetic radiation including but not limited to visible light. In various embodiments, imaging sensor includes sensor 101 and sensor support circuitry 144. Imaging sensor 103 may be included in system 100 as part of a device such as a digital camera 102, a cell phone 104, or a video recorder 106, which may be used to capture video images. In various embodiments, system 100 includes a lens 154 to focus light 152 or other wavelengths of electromagnetic radiation within system 100. System 100 may include one or more electronic circuits provided on the substrate 108. In various embodiments, lens 154 is formed as part of the electronic circuits provided on substrate 108.

In various embodiments, sensor 101 includes a plurality of complementary metal-oxide semiconductor (CMOS) imaging sensors arranged in a series of rows and columns. Embodiments are not limited to a particular number of CMOS imaging sensors, or to a particular number of row or columns of such sensors. In various embodiments, sensor 101 may include more than a million CMOS imaging sensors.

In various embodiments, system 100 includes a display 112. Display 112 is not limited to any particular type of display. In various embodiments, display 112 may comprise a plasma display or a light emitting diode (LED) display. In various embodiments, display 112 may comprise a touch screen or other type of device that allows a user to input data to system 100. In various embodiments, display 112 may be coupled to at least one circuit on substrate 108 thorough interconnect 130. In various embodiments, display 112 may be coupled to processor 116 though interconnect 130.

In some embodiments, system 100 includes a keypad 114. Keypad 114 is not limited to any particular type of keypad. In various embodiments, keypad 114 includes a keypad having backlighting to illuminate any text, characters, or symbols included on one or more keys included in keypad 114. In various embodiments, keypad 114 may be coupled to at least one circuit on substrate 108 thorough interconnect 132. In various embodiments, keypad 114 may be coupled to processor 116 though interconnect 132.

In various embodiments, system 100 includes an I/O connection 118 coupled to processor 116 through interconnect 136. I/O connection 118 and interconnect 136 are not limited to any particular type of device, and may be any type of device used to connect processor 116 to an external device (not shown) through I/O connection 118 and interconnect 136. In some embodiments, I/O connection 118 comprises a wireless connection to communicatively couple system 100 to one or more external devices (not shown), or a network, such as the Internet. In various embodiments, I/O connection 118 is coupled to a port 120 through connection interconnect 138. Port 120 is not limited to any particular type of port, and may be any type of port used to connect system 100 of one or more external devices (not shown) or a network, including the Internet. In various embodiments, I/O connection 118 is coupled to an antenna 119 to receive signals at system 100, to transmit signals from system 100, or to both receive from and transmit signals to system 100, perhaps using a transceiver.

In operation, processor 116 may operate using instructions to perform one or more memory operations involving memory device 160. These memory operations may include erasing portions of memory array 161, reading data from one or more portions of memory array 161, and writing data to memory array 161. In various embodiments, one or more of these or any other memory operations are performed on groups of erase blocks grouped together as described in the various embodiments included herein. In various embodiments, memory support circuitry 164 operates in conjunction with processor 116 to control the memory operations performed on memory array 161.

Interconnects 130, 132, 134, 136, 138, 143, and 163 are not limited to any particular type of interconnect. Interconnects 130, 132, 134, 143, and 163 may be any type of interconnect, including but not limited to physical conductors including individual wires and cables, conductive traces on a substrate, transmission lines, optical transmission cables, and wireless connections.

In operation, system 100 may receive light or other electromagnetic radiation as an image or series of images through lens 154. Lens 154 provides the incident images to sensor 101, which in turn provides electronic signals representing the images recorded by sensor 101. The pixels within sensor 101 may be individually read, and the resulting signals can be processed by imaging sensor 103 to produce at least one electrical representation of the incident image. Control and processing of the electrical representation of the recorded image or images may be controlled by the sensor support circuitry 144 included in imaging sensor 103. In various embodiments, control and processing of the image or images may be influenced by control signals provided by processor 116. In various embodiments, the image or images provide by imaging sensor 103 may be stored in memory array 161.

In various embodiments, at least one image provided by imaging sensor 103 may be displayed on display 112. In various embodiments, at least one image provided by imaging sensor 103 may be transmitted though I/O connection 118 to another device (not shown). Transmitting images provided by imaging sensor 103 may include e-mailing them to another device. In various embodiments, the images provided by imaging sensor 103 may have additional information added to the image, such as text information or other images or symbols or graphics superimposed on the at least one image provided by the imaging sensor 103. In various embodiments, text information added to the image provided by imaging sensor 103 is entered by a user through keypad 114, or through display 112. In various embodiments, text information added to the image provided by imaging sensor 103 is received through I/O connection 118, such as the text being received as an e-mail.

Figure 2:
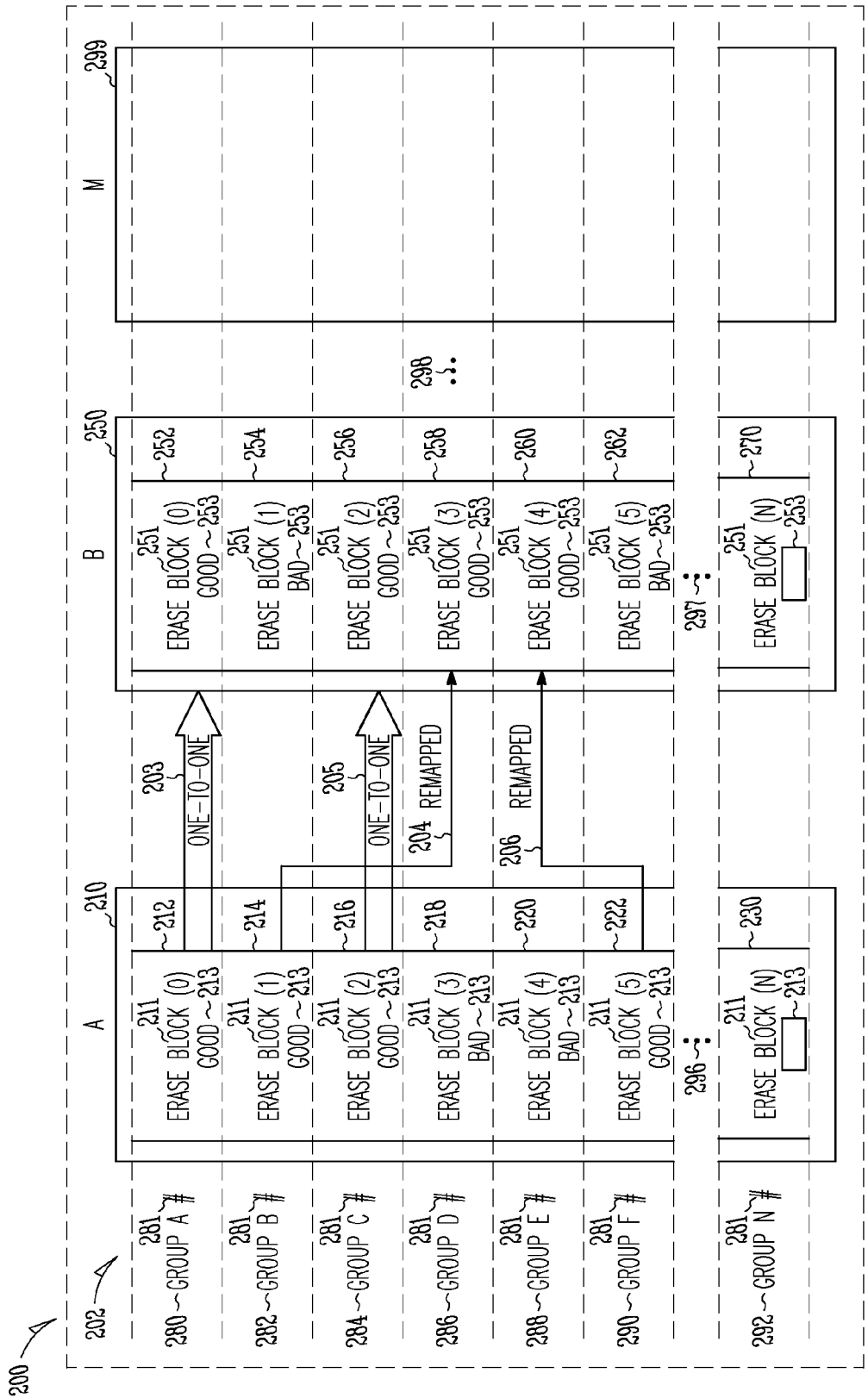
FIG. 2 is a functional block diagram of a memory device according to various embodiments of the invention.

FIG. 2 is a functional block diagram of a memory device according to various embodiments of the invention. In various embodiments, memory device 200 includes a memory array 202. Memory device 200 is not limited to any particular type of memory device. In various embodiments, memory device 200 is a NAND flash memory device. In various embodiments, one or more portions of memory device 200 include memory cells comprising NAND flash memory cells including multi-level cells operable to store two or more data bits in each multi-level cell. In various embodiments, memory array 202 represents only a portion of the memory device 200. In various embodiments, memory array 202 comprises a memory array similar to or identical to memory array 161 of FIG. 1, wherein memory array 202 is included in a memory device or some other device.

Referring again to FIG. 2, in various embodiments, memory array 202 includes a plurality of erase block groups, for example but not limited to erase block group 210, erase block group 250, and erase block group 299. The number of erase block groups in memory array 202 is not limited to a particular number of erase block groups, and may include two, three, four, or more erase block groups. Dotted line 298 between erase block group 250 and erase block group 299 represents one or more additional erase block groups that may be provided as part of memory array 202. In various embodiments, erase block group 299, and any erase block groups represented by dotted line 298, may include a plurality of erase blocks as shown in erase block group 210 and in erase block group 250.

In order to simplify the description related to FIG. 2, only erase block groups 210 and 250 are described in detail. The embodiments and features of erase block groups 210 and 250 may be equally applicable to erase block group 299 and to any erase block groups represented by dotted line 298.

In various embodiments, one or more of erase block groups 210, 250, 299, and any erase block groups represented by dotted line 298 may be formed on one or more separate dice (e.g., dice 166 in FIG. 1). In various embodiments, each of the erase block groups 210, 250, 298, 299 included in memory array 202 are located on a separate die. In various embodiments, the one or more separate dice may be included on the same substrate (e.g., substrate 168 in FIG. 1). In various embodiments, each of the erase block groups in memory array 202 are formed on a separate substrate and are physically stacked one above the other to form a memory device. In various embodiments, each of the plurality of erase block groups is located on a different die, and each of the different dies are physically stacked to form a memory device (see stack 167 and device 160 in FIG. 1).

In various embodiments, the memory device may include a processor, such as processor 116 in FIG. 1. In various embodiments, the memory device 200, including memory array 202, may include a connection or a port, such as port 120 in FIG. 1, allowing the memory device 200 to be used as a portable memory device, such as a memory stick or as a memory card. In various embodiments, port 120 comprises a Universal Serial Bus (USB) port.

Referring again to FIG. 2, erase block group 210 includes a plurality of erase blocks including erase blocks 212, 214, 216, 218, 220, 222, and 230. Erase block group 210 is not limited to a particular number of erase blocks, as indicated by the dotted line 296 between erase block 222 and erase block 230. In various embodiments, each of erase blocks 212, 214, 216, 218, 220, 222, and 230 include an erase block number 211 uniquely identifying each of the erase blocks within erase block group 210. For example, as shown in FIG. 2 erase block 212 includes an erase block number "0" uniquely identifying erase block 212 within erase block group 210 from the other erase blocks included in erase block group 210.

In various embodiments, erase blocks 214, 216, 218, 220, and 222 include an erase block number "1," "2," "3," "4," and "5" respectively, which uniquely identifies each of these erase blocks within erase block group 210 from the other erase blocks within erase block group 210. Erase block 230 represents the Nth erase block included in erase block group 210, wherein erase block 230 includes an erase block number corresponding to the "Nth" erase block included in erase block group 210, and wherein any erase block included in erase block group 210 between erase block 222 and 230 would include an erase block number uniquely identifying these erase blocks between erase block 222 and 230.

Erase block group 250 includes a plurality of erase blocks including erase blocks 252, 254, 256, 258, 260, 262, and 270. Erase block group 250 is not limited to a particular number of erase blocks, as indicated by the dotted line 297 between erase block 262 and erase block 270. In various embodiments, each of erase blocks 252, 254, 256, 258, 260, 262, and 270 include an erase block number 251 uniquely identifying each of the erase blocks within erase block group 250 from the other erase blocks within erase block group 250. For example, as shown in FIG. 2 erase block 252 includes an erase block number "0" uniquely identifying erase block 252 from the other erase blocks included in erase block group 250.

In various embodiments, erase blocks 254, 256, 258, 260, and 262 include an erase block number "1," "2," "3," "4," and "5" respectively, which uniquely identifies each of these erase blocks from the other erase blocks within erase block group 250. Erase block 270 represents the "Nth" erase block included in erase block group 250, wherein erase block 270 includes an erase block number corresponding to the "Nth" erase block included in erase block group 250, and wherein any erase block included in erase block group 250 between erase block 262 and 270 would include an erase block number uniquely identifying the erase blocks between erase block 262 and 270.

The erase blocks included in erase block groups 210 and 250 are not limited to any particular size of erase block. In various embodiments, the erase blocks within erase block groups 210 and 250 each correspond to a page of memory in memory array 202. In various embodiments, each erase block within erase block groups 210 and 250 each correspond to several pages of memory in memory array 202.

In various embodiments, each of the erase block numbers 211 uniquely identifying the erase blocks within erase block group 210 matches one and only one of the erase block numbers 251 that uniquely identifies the erase blocks in erase block group 250. In various embodiments, memory array 202 includes a plurality of erase block groups 210 and 250, wherein each of the plurality of erase block groups comprises a plurality of erase blocks 212, 214, 216, 218, 220, 222, 230 and 252, 254, 256, 258, 260, 262, and 270, each identified by a matching unique plurality of erase block numbers 211 and 251 unique within the plurality of erase blocks and matching across the plurality of erase block groups 210 and 250.

In embodiments including more than two erase block groups, the plurality of erase block groups may include a matching unique erase block number for each erase block in the plurality of erase block groups that uniquely identifies the erase blocks within each of the plurality of erase block groups, and that matches across each of the plurality of erase block groups with another erase black number in each of the other plurality of erase block groups.

In various embodiments, the erase blocks included in erase block group 210 may be associated with a status indication 213, and the erase blocks included in erase block group 250 may be associated with a status indication 253. As shown in FIG. 2 for purposes of illustration, erase blocks 212, 214, 216, and 222 include status indication 213 of "GOOD," and erase blocks 218 and 220 include a status indication 213 of "BAD." As also shown in FIG. 2 for purposes of illustration, erase blocks 252, 256, and 258, and 260 include a status indication 253 of "GOOD," and erase blocks 254 and 262 include a status indication 253 of "BAD."

Status indications 213 and 253 are not limited to any particular type phrase or value to be used as a status indication for an erase block. The designation of "GOOD" in a status indication 213 or 253 may indicate a non-defective erase block, and a status indication of "BAD" in a status indication 213 or 253 may indicate a defective erase block. A determination as to whether a particular erase block is "GOOD" or "BAD", or non-defective or defective, may be made on any basis deemed appropriate for the memory array 202 as the memory array 202 is tested and used for memory operations in any application using the memory array 202.

It should be understood that erase block 230 and any erase blocks between erase block 222 and 230 may include a status indication 211, and that erase block 270, and any erase blocks between erase block 262 and 270 may include a status indication 253.

In various embodiments, a value for the status indication associated with the erase blocks in erase block groups 210 and 250 may be stored within each of the erase blocks associated with the status indication. In various embodiments, the status indication associated with the erase blocks is stored in a memory location not included in erase blocks associated with the erase block groups. In various embodiments, a value associated with a status induction and indicating whether an erase block is defective or non-defective may be a binary bit including a value of "1" or "0" used as an indication of the status of a particular erase block.

In various embodiments, a plurality of erase blocks may be grouped together and associated with a group address in order to provide a larger block of memory associated with the group address. In various embodiments, the group address is associated with a group address number. The grouping of the erase blocks creates larger blocks of memory that may be operated on in association with the group address. For memory such as NAND flash memory where memory operations are performed on a block level, for example but not limited to a block erase of the NAND flash memory, the grouping of erase blocks within the memory into larger blocks of memory reduces the system level management associated with operations performed on the memory. In various embodiments, the grouping of erase blocks into larger groups of erase blocks may reduce the overall number of group addresses that are being managed and tacked by the systems having the larger groups of ease blocks, and thus reduce the overhead associated with managing and tracking memory operations performed on the system including the larger groupings of erase blocks.

In various embodiment, performing a block erase, write, or read function may be performed on all the erase blocks included in a plurality of erase blocks grouped together and associated with a group address by providing the commands to perform the desired memory operation on the group address, and thus reducing the number of commands and addresses required to perform a memory operation on the system including the larger groupings of erase blocks.

In various embodiments, memory array 202 includes one or more possible groups of erase blocks 280, 282, 284, 286, 288, and 290, with each of these one or more possible groups of erase blocks associated with a group address 281 including a group address number. In various embodiments and assuming only erase block groups 210 and 250 are being considered for illustration purposes, each of the one or more possible groups of erase blocks 280, 282, 284, 286, 288, and 290 is intended to include one and only one erase block from each of the plurality of erase block groups 210 and 250. Therefore, each of the one or more possible groups of erase blocks 280, 282, 284, and 290 that are actually formed include the same total number of erase blocks.

As shown in FIG. 2 by way of illustration and not limitation, the one or more group of erase blocks 280 includes erase block 212 from erase block group 210 and erase block 252 from erase block group 250, as indicated by arrow 203. As shown in FIG. 2 by way of illustration and not limited to this illustration, the one or more group of erase blocks 282 includes erase block 214 from erase block group 210 and erase block 258 from erase block group 250, as indicated by arrow 204, the one or more group of erase blocks 284 includes erase block 216 from erase block group 210 and erase block 256 from erase block group 250, as indicated by arrow 205, and the one or more group of erase blocks 290 includes erase block 222 from erase block group 210 and erase block 260 from erase block group 250, as indicated by arrow 206.

As shown in FIG. 2, erase blocks 218, 220, 254, and 262 have a status indication of "BAD," and therefore are not included in any of the one or more groups of erase blocks 280, 282, 284, and 290 that are actually formed.

As shown in FIG. 2, each of the one or more groups of erase blocks 280, 282, 284, and 290 that are actually formed includes one non-defective (as indicated by a "GOOD" status in the status indication) erase block from each of the plurality of erase block groups 210 and 250, and therefore each include the same total number of erase blocks. This arrangement allows the formation of groups of erase blocks all having only non-defective erase blocks and all being of the same size, wherein each of the grouped erased blocks is associated with a group address. Such an arrangement allows memory operations to be performed on these grouped erase blocks by designating a group address and knowing that any of these group addresses correspond to a portion of memory array 202 having all non-defective erase blocks and of a known overall size. Thus, the overhead associated with performing the memory operations and the overhead associated with the management of these erase block during memory operations is reduced.

As shown in FIG. 2, at least one of the one or more groups of erase blocks 280, 282, 284, and 290 includes a grouping of only erase blocks having a same matching unique erase block number. For example, the one or more group of erase blocks 280 includes erase block 212 and 252 wherein both of erase blocks 212 and 252 include a same erase block number 211, 251, that being erase block "0". In another example, the one or more group of erase block 284 includes erase block 216 and 256, wherein both of these erase blocks include a same erase block number 211, 251, that being erase block number "2." These grouping of erase blocks may be referred to as one-to-one grouping because each of the erase blocks in the one-to-one grouping has a same matching unique erase block number as every other erase block included in the grouping.

As also shown in FIG. 2, at least one of the one or more groups of erase blocks 280, 282, 284, and 290 include a grouping of erase blocks including having at least one erase block from erase block group 250 having a same erase block number 251 as a corresponding erase block number 211 being designated as a defective or "BAD" erase block in the group of erase block group 210. For example, the one or more group of erase blocks 282 includes erase block 214 from erase block group 210 and erase block 258 from the erase block group 250, wherein erase block 258 includes an erase block number "3" corresponding to a same erase block number "3" of erase block 218 in erase block group 210, and wherein erase block 218 includes a status indication of "BAD" indicating a defective block. In another example, the one or more group of erase blocks 290 includes erase block 222 from erase block group 210 and erase block 260 from the erase block group 250, wherein erase block 260 includes an erase block number "4" corresponding to a same erase block number "4" of erase block 220 in erase block group 210, and wherein erase block 220 includes a status indication of "BAD" indicating a defective block.

These grouping of erase blocks may be referred to as a "re-mapped" grouping because at least one of the erase blocks in the grouping has an erase block number corresponding to a defective erase block not included in the grouping and therefore not all the erase blocks in the grouping can have a same matching unique erase block number. This is in contrast to a one-to-one grouping that does have a same matching unique erase block number for every erase block included in the grouping.

Also as illustrated in FIG. 2, one or more possible erase block groups associated with erase blocks 286 and 288 are not formed as a group of erase blocks. In various embodiments, this is because the erase block in the erase block group designated as the base erase block group, in this instance erase block group 210 for illustrations purposes, erase blocks 286 and 288 both have a status indication 213 of "BAD," and so no grouping associate with these one or more groups of erase blocks is formed. Thus, there is no grouping of erase blocks formed to include erase block 218 associated with the one or more possible erase block group 288, and there is no grouping of erase blocks formed to include erase block 220 associated with the one or more possible erase block group 290.

However as described above, one or more erase blocks having a same matching unique erase block number as a defective erase block in the base erase block group 210 may be re-mapped to form a one or more groups of erase blocks with a non-defective erase block from the designated base erase block group. In various embodiments, the matching unique erase block number of this erase block from a erase block group other than the base erase block group and having a same matching unique erase block number as a defect erase block in the base erase block group is remapped into an erase block grouping to include a non-defective erase block from the base erase block group.

In various embodiments, the one-to-one and re-mapped combinations of erase blocks associated with the one or more groups of erase blocks may be formed as follows. A determination is made for each of the erase blocks included in erase block groups as to whether the particular erase block is defective or is non-defective. For any of the plurality of erase blocks wherein each of the plurality of erase blocks having a same matching unique erase block number across the plurality of erase block groups is non-defective across all of the erase block groups, a grouping of erase blocks is formed including one each of the plurality of erase blocks from each of the plurality of erase block groups and having a same matching unique erase block number. This grouping of erase blocks may be referred to as a one-to-one grouping. In a one-to-one grouping where the group address number is the same as the matching unique erase block number, the erase block number for any and all the erase blocks in the one-to-one groups may be the same number as the group address number, so that no mapping is required in order to determine which erase blocks are included in the one-to-one grouping.

One of the erase block groups is designated as a base erase block group. This designation is not limited to any particular erase block group in the plurality of erase block groups being designated as the base erase block groups, and in various embodiments may be determined by selecting the erase block group that will enable the most additional groups of erasable blocks to be formed as described herein.

In various embodiments, a determination is made as to whether additional grouping of non-defective erase blocks can be made, starting by locating non-defective erase blocks in the base erase block group that have not been included in one-to-one groupings. In various embodiments, these non-defective erase blocks from the base erase block group were not included in a one-to-one grouping because at least one erase block from the at least one of the erase block groups other than the base erase block group and having a same erase block number as the non-defective erase block from the base erase block group was determined to be defective. For any one of these such non-defective erase blocks in the base erase block group, a determination as to whether there is at least one erase block in each of the erase block groups other than the base erase block group that is both non-defective and is not already included in a grouping of erase blocks across the plurality of erase block groups is made. If these conditions are met, an additional grouping of erase blocks is formed to include the non-defective erase block from the base erase block group and one each of the non-defective erase blocks from each of the plurality of erase block groups other than the base erase block group that were not already included an erase block grouping. These types of groupings of erase blocks may be referred to as "re-mapped" groupings.

In various embodiments, the above described process for forming re-mapped groups of erase blocks may be repeated until no additional grouping may be formed for any non-defective erase blocks in the base erase block group that are not already formed into either a one-to-one grouping or into a re-mapped grouping. In various embodiments, no additional grouping may be formed whenever there are no longer any non-defective erase blocks in the base erase block group that have not already been included into either a one-to-one grouping or a re-mapped grouping. In various embodiments, no additional grouping may be formed when there are one or more non-defective erase blocks in the base erase block group that have not been included in either a one-to-one grouping or a remapped grouping but wherein there is not at least one non-defective erase block remaining in each of the plurality of erase block groups across the plurality of erase block groups that have not already been included in either a one-to-one grouping or a re-mapped grouping.

In various embodiments, the remapped grouping of erase block is associated with the group address having a group address number the same as the erase block number identifying the erase block from the base erase block group included in the remapped grouping. By way of illustration, the one or more groups of erase blocks 282 including erase blocks 214 and 258 may associate with group address number "1" corresponding to the erase block number associated with erase block 214 of the base erase block group.

In various embodiments, these additional groups of erase blocks are formed until no additional groups of erase blocks may be made based on the requirements for forming these additional groupings of erase blocks.

Once the one-to-one grouping and the one or more groups of additional erase blocks are formed based upon the remapped groupings, operations on the memory may be performed based upon the group addresses associated with these one or more groups of erase blocks.

It would be understood that one of these plurality of groupings of erase blocks may included erase block 230, and may include one or more erase blocks between erase block 222 and 230, and may include erase block 270, and may include one or more erase blocks between erase block 262 and 270 in any of the various combinations of groupings of erase blocks as described herein. The described groupings of erase blocks including the one or more groups of erase blocks 280, 282, 284, and 290 are included for illustration purposes.

Embodiments are not limited to forming the one or more possible groups of erase block using only two erase block groups. Both one-to-one erase block groups and re-mapped erase block groups may be formed using a plurality of erase block groups including one-to-one erase block groups and remapped erase block groups each comprising one erase block from each one of the plurality of erase block groups wherein there are three or more erase block groups included in the plurality of erase block groups. For example, but not limited to this example, groupings including erase blocks from erase block groups 210, 250, 299, and any erase block groups between erase block groups 250 and 299 represented by dotted line 298 may be made. In addition, remapped erase block groups may be formed, if possible, as described above and depending on the availability of non-defective erase blocks, by combining an erase block from a designated base erase block group with one erase block from each of the plurality of erase block groups other than the designated base erase block group including erase block groups 210, 250, 299, and any erase block groups between erase block groups 250 and 299 represented by dotted line 298 and at least one of the erase blocks from the plurality of erase block groups other than the designated base erase block group has matching unique erase block number identifying a defective erase block in the base erase block group.

In various embodiments, it may not be possible to form any remapped grouping of erase blocks. For example, if there is only one defective erase block detected in any of the plurality of erase block groups included in the erase block grouping, it would not be possible to form a remapped grouping of erase blocks. It is not necessary that a remapped grouping of erase block be actually formed in order to unitize embodiments described herein in a memory device.

Embodiments are not limited to forming the one or more possible groups of erase block using a single set of erase blocks groups to form all of the erase block groups. For example, a plurality of erase block groups may be used wherein two or more sets of erase block groups may be organized into separate pluralities of erase block groups, and wherein the groupings of erase blocks may be made separately within each of the separate pluralities of erase block groups. These separate erase block groups including the separate groupings of erase blocks may be associated with a common group address number, thereby creating an associated set of a plurality of erase block groups associated with a common group address number.

As would be understood by one of ordinary skill in the art, further groupings of these associated sets of a plurality of erase block groups may be formed in order to create hierarchical sets of the associated sets of a plurality of erase block groups. These hierarchical sets may be further associated with a higher level group address number associated with each of the associated sets of the plurality of erase block groups. The number of levels within the hierarchical sets is not limed to any particular number of levels, and may be made in accordance with any combination of levels deem appropriate for the application to which the hierarchical set scheme is being applied.

In various embodiments, the mapping of non-one-to-one groupings may be stored in a mapping table.

FIG. 3 is a mapping table according to various embodiments of the invention. In various embodiments, mapping table 300 includes rows 310 and one or more columns 301, 302, 304, 306, and 308. In various embodiments, column 301 includes a row number for each of the rows 310 included in mapping table 300. In various embodiments, column 301 includes ascending integers beginning at zero arranged sequentially to identify each of rows 310 included in mapping table 300.

In various embodiments, rows 310 include a predetermined number of rows, wherein the predetermined number of rows sets a maximum number of mappings for combinations of erase blocks that may be stored in mapping table 300. In various embodiments, the number of columns included in mapping table 300 is determined by the number of erase block groups included in the forming of the combination of erase blocks. In various embodiments, mapping table 300 includes a column 302 associated with the base erase block group, and additional columns 304, 306, and 308 associated with one each of the erase block groups other than the base erase block group. Column 308 is associated with an "Mth" column associated with an "Mth" erase block group. Column 306 is associated with one or more columns between column 304 and 308 as would be associated with one or more erase block groups between an erase block group associated with column 304 and the Mth erase block group associated with column 308.

For illustrations purposes, column 302 is associated with the erase block group 210 from FIG. 2, column 304 is associated with erase block group 250 from FIG. 2, and columns 406 and 408 are associated with any additional erase block groups included in memory array 202.

As shown in FIG. 3, row 312, includes a number "1" in column 302 and a number "3" in column 304. The number "1" in column 302 represents the matching unique erase block number associated with erase block 214 in FIG. 2, and the number "3" in column 304 represents the matching unique erase block number associated with erase block 258 in FIG. 2. Thus, the entries in row 312 represent a mapping of the one or more group of erase block 282 and associated with group address number 1, as included in row 312 and column 302 of mapping table 300. It would be understood that various embodiments could include more than two erase block groups, the mapping for each additional erase block group associated with group address "1" could be added into row 312 under columns 306 and 308 to complete the mapping.

In mapping table 300, row 314 includes a number "5" in column 302 and a number "4" in column 304. The number "5" in column 302 represents the matching unique erase block number associated with erase block 222 in FIG. 2, and the number "4" in column 304 represents the matching unique erase block number associated with erase block 268 in FIG. 2. Thus, the entries in row 314 represent a mapping of the one or more group erase block 290 and associated with group address number "5", as included in row 314 and column 302 of mapping table 300. It would be understood that various embodiments could include more than two erase block groups, the mapping for each additional erase block group associated with group address number "5" could be added into row 314 under columns 306 and 308 to complete the mapping.

Rows 316, 318, 320, and 330 represent one or more additional rows included in mapping table 300. One or more of rows 316, 318, 320, and 330 may or may not include additional mappings of erase blocks as shown for rows 312 and 314 but including different combinations of erase block from those shown in rows 312 and 314 and from each other row.

In various embodiments, mapping table 300 provides a place for storing the mapping of the non-one-to-one grouping of erase blocks across a plurality of erase block groups. This allows for the use of these erase blocks in memory operations as groups of erase blocks having the same size and the same number of erase blocks as each of the one-to-one grouping of erase blocks that may also be used in memory operation on a same memory array or a same memory device. In various embodiments, the mapping table is stored in a system area of the NAND flash memory device. In various embodiments, the system area of the NAND flash memory is for example memory 165 in the memory support circuitry as shown in FIG. 1.

In various embodiments, when a memory operation is to be performed, a target group address number is determined. The target group address number represents the group address mapping the portion of a memory device or a memory array on which the memory operation is to be performed. A search of the mapping table may then be performed to determine if a group address number that matches the target group address number is included in the mapping table. In various embodiments, the search is performed, for example, on column 302, the column in the mapping table including a matching unique erase block number associated with the erase block from the base erase block group included in each combination mapped in each row of the mapping table. The number in column 302 corresponds to the group address number, so the target group address number may be compared to each of the numbers in column 302 to determine if any of these group address numbers match the target group address number.

If a match for the target group address number is found in the mapping table, a mapping of the erase blocks including the grouping of the erase blocks associated with the group address number matching the target group address number may be read from the mapping table and used to perform the memory operation using the erase blocks included in the read mapping in performing the memory operation.

If a match is not found in the mapping table, the plurality of erase blocks associated with the group address number is assumed to be a one-to-one grouping of erase blocks all having a same matching unique erase block number and a same group address number as this same matching unique erase block number. Therefore, the memory operation may be performed using the erase block numbers all having the same matching unique erase block number as the target number without resorting to reading a mapping.

A search of the mapping table to determine if there is a group address number matching the target group address number is not limed to any particular type of search or to any particular search technique. Any type of search or search technique may be used. Various embodiments include an index table including one or more ranges of group address numbers and associated offsets into a mapping table to speed the search of the mapping table.

FIG. 4 is an index table according to various embodiments of the invention. Index table 400 includes a plurality of rows 410 including rows 412, 414, 416, 418, 420, 422, and 430 and columns 401, 402, and 404. In various embodiments, column 401 includes a row number for each of the rows 410 included in index table 400. In various embodiments, column 401 includes ascending integers beginning at zero arranged sequentially to identify each of rows 410 included in index table 400.

In various embodiments, column 402 is associated with ranges of group address numbers. In various embodiments, these ranges of group address numbers are associated with the ranges of group address numbers associated with the mapping table for which the index table is being used in conjunction with in order to speed up a search of the mapping table.

In various embodiments, column 404 includes an offset into the mapping table associated with each one of the ranges of group address numbers. By determining which of rows 410 includes a group address number associated with a target group address number to be searched for in the mapping table, the index table provides an offset value into the mapping table before the searching of the mapping table begins. By using the offset into the mapping table as a starting point in the mapping table, the search of the rows of the mapping table may be started in a row closer to a row in the mapping where the target group address number would be found if present, as compared to a search of the mapping table where the search is started, for example, at the first row or the beginning row of the mapping table.

For illustration purposes, column 402 includes a range of group address numbers including group address numbers 0-1 in row 412, a range of group address numbers including group addresses numbers 2-3 in row 414, a range of group address numbers including group address numbers 4-5 in row 416, a range of group address numbers including group address numbers 6-7 in row 418, and a range of group address numbers including group address numbers 8-9 in row 420. For any given target address numbers between 0 and 9, a corresponding offset value may be determined from column 404 of index table 400 by finding the row in the index table 400 that includes in the range of group address numbers a number matching the target group address number.

The corresponding offset value may then be used to determine the entry point for searching the mapping table, and eliminating the necessity to search rows in the mapping table, for example rows below the potential position of the group address number matching the target group address number. In various embodiments, the offset into the mapping table corresponds to the sequential row number of the mapping table. By way of illustration, the offset values in column 404 of index table 400 in FIG. 4 may correspond to the row numbers in column 301 of the mapping table 300 in FIG. 3. Thus, by way of example, offset values "0" for rows 412 and 414 in index table 400 would indicate that a search of mapping table 300 should be initiated at row 312 of mapping table 300 corresponding to mapping table row number "0" in column 301. In another example, offset values "1" for rows 416, 418, and 420 in index table 400 would indicate that a search of mapping table 300 should be initiated at row 314 of corresponding to row "1" in column 301 of mapping table 300.

In various embodiments, the offset values included in column 404 are determined based on the span of ranges of group address numbers and the results of populating the mapping tale with the possible combinations erase blocks mapped into the mapping table 300.

In various embodiments, the offset values included in column 404 of the index table are calculated by taking the target address number and dividing it by a span to obtain a quotient. The span is determined to be a number equal to the number of group address included in each of the ranges of group addresses included in column 402 of the index table. Once the quotient is determined, the quotient is truncated so as to include only the integer portion of the quotient resulting in a zero or a positive integer. The zero or positive integer corresponds to a single row in the index table 400 including an offset value in column 404.

The offset value from column 404 represents the row number for a point of entry into the mapping table associated with the index table. Searching the mapping table for a group address number may begin at the row of the mapping table wherein the mapping table includes group address numbers arranged in a descending or ascending arrangement. Therefore, any row before the row indicated by the offset value will not contain the group address number matching the target address number.

In embodiments having the group address numbers arranged in ascending order, a search of the mapping table may be terminated when either a matching number is found or when a matching number being compared to the target address number is higher than the target address number. In the second situation, a group address number matching the target address number is not stored in the mapping table.

For illustration purposes, for a target address of "3", and for the index table 400 having a span of 2 associated with a range of 2 group addresses for each row in column 402, the target address "3" divided by the span of 2 represent 3/2, and when truncated provides a value of 1. Using the truncated value of 1 as an indicator of row 1 in index table 400, an offset into the mapping table is determined to have a value of zero for row 414 of index table 400.

Using the offset value of zero as the entry point into mapping table 300 of FIG. 3, the target address value of "3" is compared to the group address number "5" in row 414 (row 1) in column 402. As the target address value "3" does not match the group address number "5" for row 1, and is less than the group address number, the search of the mapping table is complete without having to compare the target address number to the group address value of row 412 or any of the rows 416, 418, 420, and 430 of the mapping table. The time required to determine whether a group address number is included in the mapping table is thus reduced.

Figure 5:
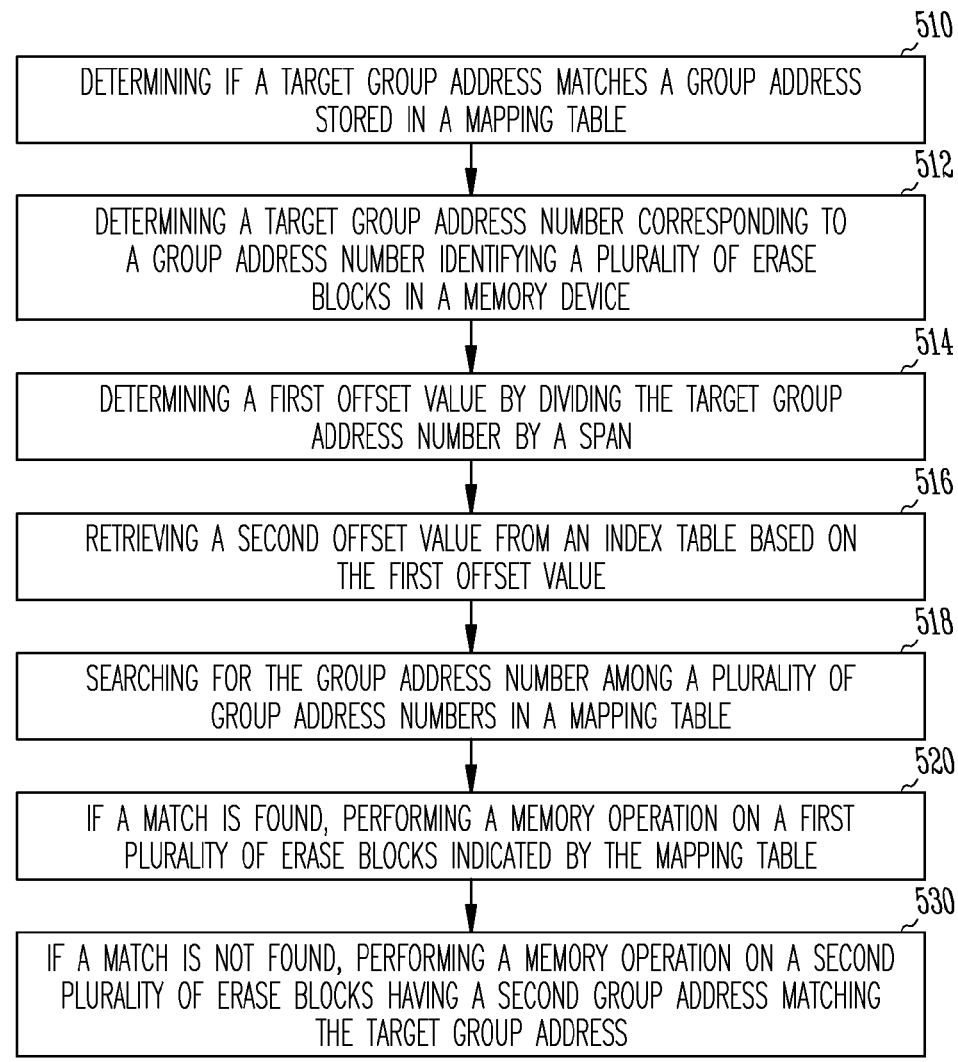
FIG. 5 is a flow diagram illustrating several methods according to various embodiments of the invention.

FIG. 5 is a flow diagram illustrating several methods according to various embodiments of the invention. Method 500 at block 510 may begin by determining if a target group address matches a group address stored in a mapping table.

Various embodiments of method 500 including the mapping table further include providing a status indication for each erase block included in the plurality of erase block groups including a base erase block group, the status indication having either a defective or a non-defective indication value. Various embodiments further include limiting a plurality of group addresses stored in the mapping table, including the group address, to a maximum number.

Method 500 at block 512 may include determining a target group address number corresponding to a group address number identifying a plurality of erase blocks in a memory device. Various embodiments may include providing an index table including a plurality of ranges of group addresses, wherein each range of group addresses corresponds to one of a plurality of values of offsets into the mapping table.

Method 500 at block 514 may include determining a first offset value by dividing the target group address number by a span.

Method 500 at block 516 may include retrieving a second offset value from an index table based on the first offset value.

Method 500 at block 518 may include searching for the group address number among a plurality of group address numbers in a mapping table to determine if the target group address is included in the mapping table. Various embodiments may include the searching for the group address number beginning at a point in the mapping table determined by the second offset value, wherein any of the plurality of group address numbers in the mapping table corresponds with a mapping of one each of a plurality of erase blocks from one each of a plurality of erase block groups including a base erase block group, wherein all the plurality of erase blocks in the mapping are non-defective and at least one of the plurality of erase blocks in the mapping has a matching unique erase block number identifying a defective erase block in the base erase block group.

Various embodiments of method 500 may include wherein for each mapping of one each of the plurality of erase blocks from one each of the plurality of erase block groups including the base erase block group, the corresponding group address number for any one particular mapping is a same number as the matching unique erase block number corresponding to an erase block from the base erase block group that is included in the any one particular mapping. Various embodiments of method 500 may include wherein determining a first offset value by dividing the target group address by a span includes truncating to an integer value including zero, the quotient produced by dividing the target group address by the span, and using the integer value as the first offset value.

Various embodiments of method 500 may include wherein determining the second offset value includes locating in the index table the second offset value corresponding to the integer value. Various embodiments of method 500 may include wherein determining a target group address includes determining a group address on which a memory operation is to be performed. Various embodiments of method 500 may include wherein determining if the target group address is included in the mapping table includes finding a group address in the mapping table that matches the target group address.

Method 500 at block 520 may include if a match is found, performing a memory operation on a first plurality of erase blocks indicated by the mapping table and having a first group address matching the target group address.

Various embodiments may include wherein the first plurality of erase blocks is selected from a plurality of erase block groups including a base erase block group.

Various embodiments of method 500 further include providing a status indication for each erase block included in the plurality of erase block groups including a base erase block group, the status indication having either a defective or a non-defective indication value.

Various embodiments may include wherein each of the plurality of erase block groups comprises a plurality of erase blocks each identified by a matching unique plurality of erase block numbers unique within the plurality of erase blocks and matching across the plurality of erase block groups. Various embodiments may include wherein the first plurality of erase blocks includes one non-defective erase block from the base erase block group and one non-defective erase block from each of the plurality of erase block groups other than the base erase block group. Various embodiments may include wherein at least one first plurality of erase blocks from an erase block group other than the base erase block group includes a first matching unique erase block number the same as a matching unique erase block number identifying a defective erase block in the base erase block group.

Various embodiments of method 500 may include wherein the first group address matches the matching unique erase block number of the erase block from the base erase block group included in the first plurality of erase blocks. Various embodiments of method 500 may include if a group address number matching the target group address is included in the mapping table, performing an operation on the memory device using the erase blocks included in the remapped group address from the mapping table matching the target group address.

Method 500 at block 530 may include, if a match is not found, performing a memory operation on a second plurality of erase blocks having a second group address matching the target group address.

Various embodiments may include wherein the second plurality of erase blocks is selected from the plurality of erase block groups including the base erase block group and includes one non-defective erase block having a same matching unique erase block number form each of the plurality of erase block groups.

Various embodiments may include wherein the second group address matches the matching unique erase block number of the erase block from the base erase block group included in the second plurality of erase blocks. Various embodiments of method 500 may include if the target group address in not included in the mapping table, performing an operation on the memory device using the erase block from each of the plurality of erase block groups that have an erase block number matching the target group address.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims and the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

Voltage magnitudes for "low" logic signals and "high" logic signals are normally not defined since they can have a variety of relative values including negative voltages and positive voltages. "High" and "low" logic signals are defined only by their relationship to one another in representing binary values. Typically, a "high" logic signal has a voltage level or potential higher than a "low" logic signal, or the "low" signal may have a different polarity or negative polarity than the "high" signal. As those skilled in the art well understand, in some logic systems, a "high" logic value may even be represented by a ground potential when the relative "low" logic value is represented by a negative voltage potential in reference to ground.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. A method comprising:
   determining whether each of a plurality of memory blocks in a memory device is defective, wherein the plurality of memory blocks are organized into memory block groups, and wherein one of the memory block groups comprises a base memory block group;
   forming a grouping of non-defective memory blocks;
   if at least one memory block not included in the base memory block group is determined to be defective and a memory block from the base memory block group is determined to be non-defective, and if there is at least one non-defective memory block in the memory block group that includes the defective memory block and the at least non-defective memory block is not included in another grouping of memory blocks, forming a remapped grouping of memory blocks that includes the non-defective memory block from the base memory block group and the at least one non-defective memory block in the memory block group that includes the defective memory block; and
   storing a mapping of the remapped grouping in at least one of the memory device and a processor coupled to the memory device.

2. The method of claim 1, wherein the plurality of memory blocks comprises a plurality of erase blocks.

3. The method of claim 2, wherein the plurality of erase blocks have a same matching unique erase block number.

4. The method of claim 3, wherein the non-defective erase block from the base erase block group and the at least one non-defective erase block in the erase block group that includes the defective erase block and that is not included in another grouping of erase blocks do not have a same matching unique erase block number.

5. The method of claim 1, further comprising:
   selecting a memory block group among the memory block groups that will enable the most additional groupings of non-defective memory blocks as the base memory block group.

6. The method of claim 1, further comprising:
   repeating the method until no additional grouping may be formed for any non-defective memory blocks in the base memory block group that are not already formed in a grouping.

7. The method of claim 1, further comprising:
   associating the remapped grouping with a group address having a group address number that is the same as a block number identifying the memory block from the base memory block group included in the remapped grouping.

8. The method of claim 7, further comprising:
   performing memory operations based upon the group address associated with the remapped grouping.

9. The method of claim 1,
   wherein the mapping of the remapped grouping is stored in a mapping table in the memory device.

10. The method of claim 9, further comprising:
    storing in the mapping table at least one group address number corresponding to a matching unique erase block number among one of a plurality of matching unique erase block numbers identifying a non-defective erase block in the base memory block group and corresponding to several of the matching unique erase block numbers identifying a single non-defective erase block in each of the memory block groups other than the base memory block group.

11. The method of claim 9, wherein the memory device comprises a portable memory device.

12. The method of claim 9, further comprising:
storing a value corresponding to a range of group addresses included in the memory device in the mapping table.

13. The method of claim 9, further comprising:
storing a first group address in the mapping table, wherein the memory device includes a second group address not stored in the mapping table.

14. The method of claim 13, wherein the second group address includes a group address number corresponding to an erase block number identifying a non-defective memory block from the base memory block group and one erase block number identifying a non-defective memory block from each of the memory block groups other than the base memory block group with a same erase block number as the non-defective memory block from the base memory block group.

15. The method of claim 9, wherein the grouping of non-defective memory blocks is associated with a group address, and the method further comprising:
searching for the group address in the mapping table.

16. The method of claim 15, further comprising:
performing a memory operation on a first group of memory blocks in the first plurality of memory blocks indicated by the mapping table if a match of the group address is found in the plurality of group addresses in the mapping table.

17. The method of claim 16, further comprising:
performing a memory operation on a second group of memory blocks in the plurality of memory blocks, if a match of the group address is not found in the plurality of group addressed in the mapping table.

18. The method of claim 1, wherein the memory block groups is located on different dice of the memory device.

19. The method of claim 18, wherein dice are arranged in a stack.

20. The method of claim 1, wherein the mapping of the remapped grouping is stored in a mapping table in the processor.

* * * * *